United States Patent [19]

Kurosawa

[11] Patent Number: 5,453,936

[45] Date of Patent: Sep. 26, 1995

[54] COMPUTER AIDED HARDWARE DESIGN SUPPORT SYSTEM AND METHOD FOR PROCESSING MANUAL AND AUTOMATIC FUNCTIONAL ELEMENT BLOCKS

[75] Inventor: Yuichi Kurosawa, Tokyo, Japan

[73] Assignee: Kabushiki Kaisha Toshiba, Kawasaki, Japan

[21] Appl. No.: 954,029

[22] Filed: Sep. 30, 1992

[30] Foreign Application Priority Data

Sep. 30, 1991 [JP] Japan ..................................... 3-252628

[51] Int. Cl.$^6$ ................................................... G06F 17/50
[52] U.S. Cl. ........................................... 364/489; 364/488
[58] Field of Search ..................................... 364/488, 489, 364/490, 491, 578; 395/500

[56] References Cited

U.S. PATENT DOCUMENTS

| | | | |
|---|---|---|---|
| 4,703,435 | 10/1987 | Darringer et al. . | |
| 4,896,272 | 1/1990 | Kurosawa | 364/489 |
| 5,029,102 | 7/1991 | Drumm et al. | 364/489 |
| 5,146,583 | 9/1992 | Matsunaka et al. | 364/489 |
| 5,197,016 | 3/1993 | Sugimoto et al. | 364/490 |
| 5,222,030 | 6/1993 | Dampelo et al. | 364/489 |
| 5,239,465 | 8/1993 | Hattori et al. | 364/491 |
| 5,331,569 | 7/1994 | Iijima | 364/489 |
| 5,345,393 | 9/1994 | Ueda | 364/489 |

OTHER PUBLICATIONS

"A Functional Language for Description and Design of Digital System: Sequential Constructs" by Meshkinpour et al, IEEE 22nd DAC, 1985, pp. 238–244.
"Methods Used in an Automatic Logic Design Generator (ALERT)" by Friedman et al., IEEE Trans. on Computer, vol. C–18, No. 7, Jul. 1969, pp. 593–614.
"An Overview of Logic Synthesis Systems" by L. Trevillyan, 24th ACM/IEEE DAC, pp. 166–172, 1987.
"A New Look at Logic Synthesis" by Darringer et al., IEEE 17th DAC, 1980, pp. 543–549.

*Primary Examiner*—Vincent N. Trans
*Attorney, Agent, or Firm*—Oblon, Spivak, McClelland, Maier & Neustadt

[57] ABSTRACT

A hardware design support system for processing a general functional specification described in a hardware description language. A general functional specification is divided into a functional specification with a first functional element block of first functional elements and a second functional element block of second functional elements for reedition. The hardware design support system indicates a first mode inputting and information to specify the second functional elements and a second mode inputting an information to specify the first functional elements. An interface signal generator first acquires input/output elements from the first functional elements associated with the second functional elements according to the first mode and generates necessary interface signal information exchanged between the first functional element block and the second functional element block. Second, the interface signal generator acquires input/output elements from the first functional elements associated with the first functional elements according to the second mode and generates necessary interface signal information exchanged between the second functional element block and the first functional element block. A functional specification divider replaces a description of the second functional elements described in the functional specification to a description using the interface signal information generated by the interface signal generator to produce a functional specification of the first functional element block.

12 Claims, 21 Drawing Sheets

| RESOURCE NAME | TYPE | msb | lsb | WORD SIZE | FLAG |
|---|---|---|---|---|---|
| CLK | IN | -1 | -1 | -1 | 1 |
| START | IN | -1 | -1 | -1 | 1 |
| SCAR | IN | -1 | -1 | -1 | 1 |
| OUTDAT | OUT | 0 | 15 | -1 | 1 |
| ACC | REG | 0 | 15 | -1 | 1 |
| IR | REG | 0 | 15 | -1 | 1 |
| MAR | REG | 0 | 9 | -1 | 1 |
| LOC | REG | 0 | 9 | -1 | 1 |
| M | RAM | 0 | 15 | 1024 | 1 |

```
LINE NO.
1      <INTS> SIMPLE ;
2      <IN>  CLK,START,SCLR ;
3      <OUT> OUTDAT<0:15>   ;
4      <REG> ACC<0:15>, IR<0:15>,MAR<0:9>,LOC<0:9> ;
5      <RAM> M{1024} <0:15> ;

6      <STT> CLK ;
7       INIT ; LOC = 0 ;
8              IF START THEN NEXT ADR ;
9                       ELSE NEXT INIT ;
10             ENDIF ;
11      ADR : MAR = LOC ;   LOC = LOC + 1 ;
12            NEXT IFT ;
13      IFT : IR = M{MAR} ;
14            NEXT DECODE ;
15      DECODE ;
16         CASE IR<0:5> OF
                 1 :: NEXT AD ;
                 2 :: NEXT SB ;
                 4 :: NEXT LD ;
20               8 :: NEXT STR ;
                16 :: NEXT STR ;
                32 :: NEXT INIT ;
             OTHERS :: NEXT ADR ;
             ENDCASE :
25         MAR = IR<6:15> ;
        AD :
          ACC = ACC + M{MAR} ;
          NEXT ADR ;
        SB :
```

F I G. 4

```
LINE NO.
 15    DECODE :
 16      CASE  IR<0:5>  OF
              1 :: NEXT AD ;
              2 :: NEXT SB ;
              4 :: NEXT LD ;
 20           8 :: NEXT STR ;
             16 :: NEXT STR ;
             32 :: NEXT INIT ;
         OTHERS :: NEXT ADR ;
           ENDCASE ;
 25      MAR = IR<6:15> ;
       AD :
         ACC = ACC - M{MAR} ;
         NEXT ADR ,
       SB :
 30      ACC = ACC - M{MAR} ;
         NEXT ADR ;
       LD :
         ACC = M{MAR} ;
         NEXT ADR ;
       STR :
 36      M{MAR} = ACC ;
         NEXT ADR ;
       BR :
         LOC = IR<6:15> ;
 40      NEXT ADR ;
 41    <ENDSTT> ;
 42    <STC>
 43      OUTDAT = ACC ;
 44    <ENDSTC> ;
 45    <EXC> SCLR :  NEXT INIT ;
 46    <ENDEXC> ;
 47    <ENDINTS> ;
```

F I G.  5

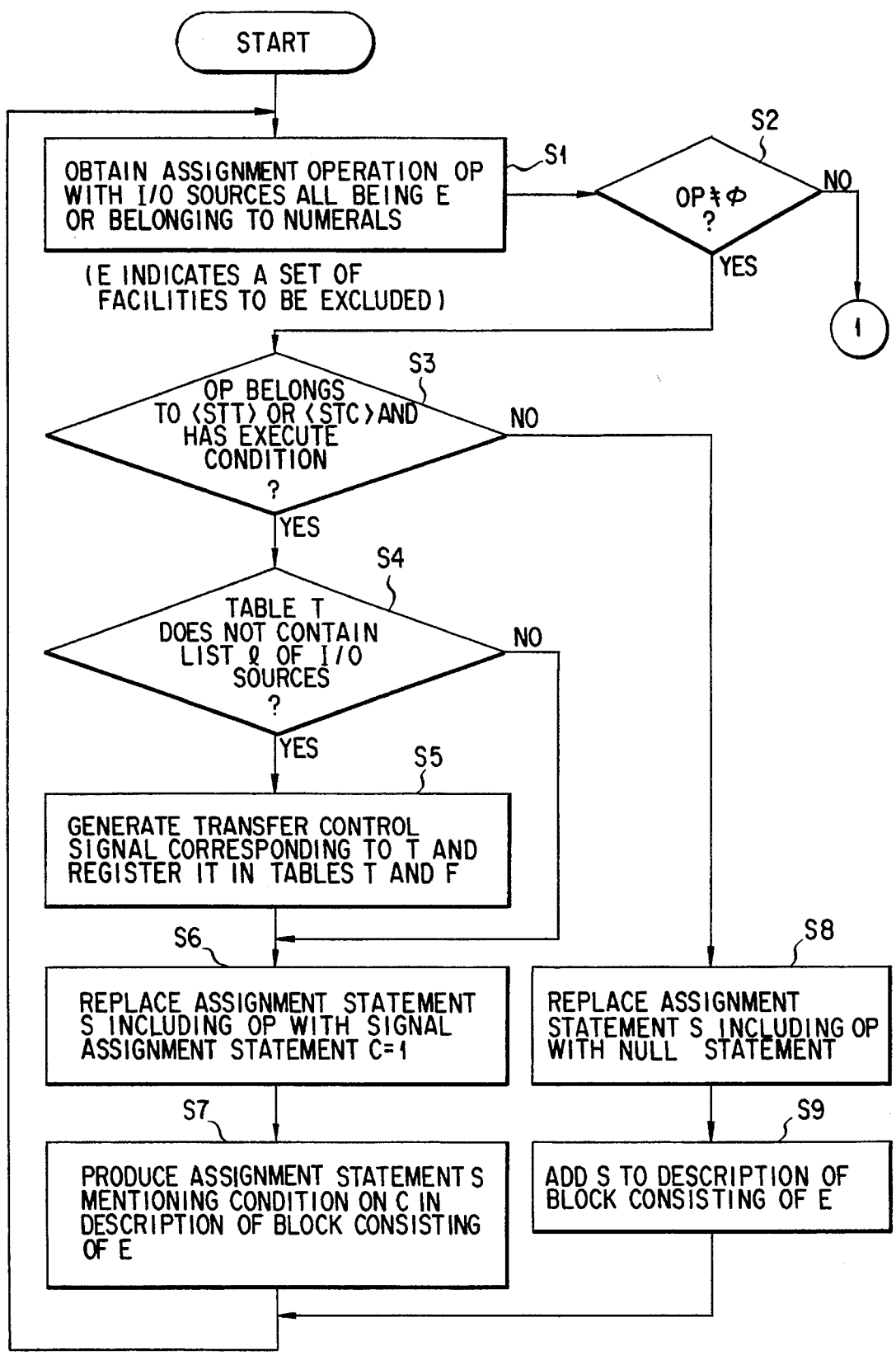
F I G. 6

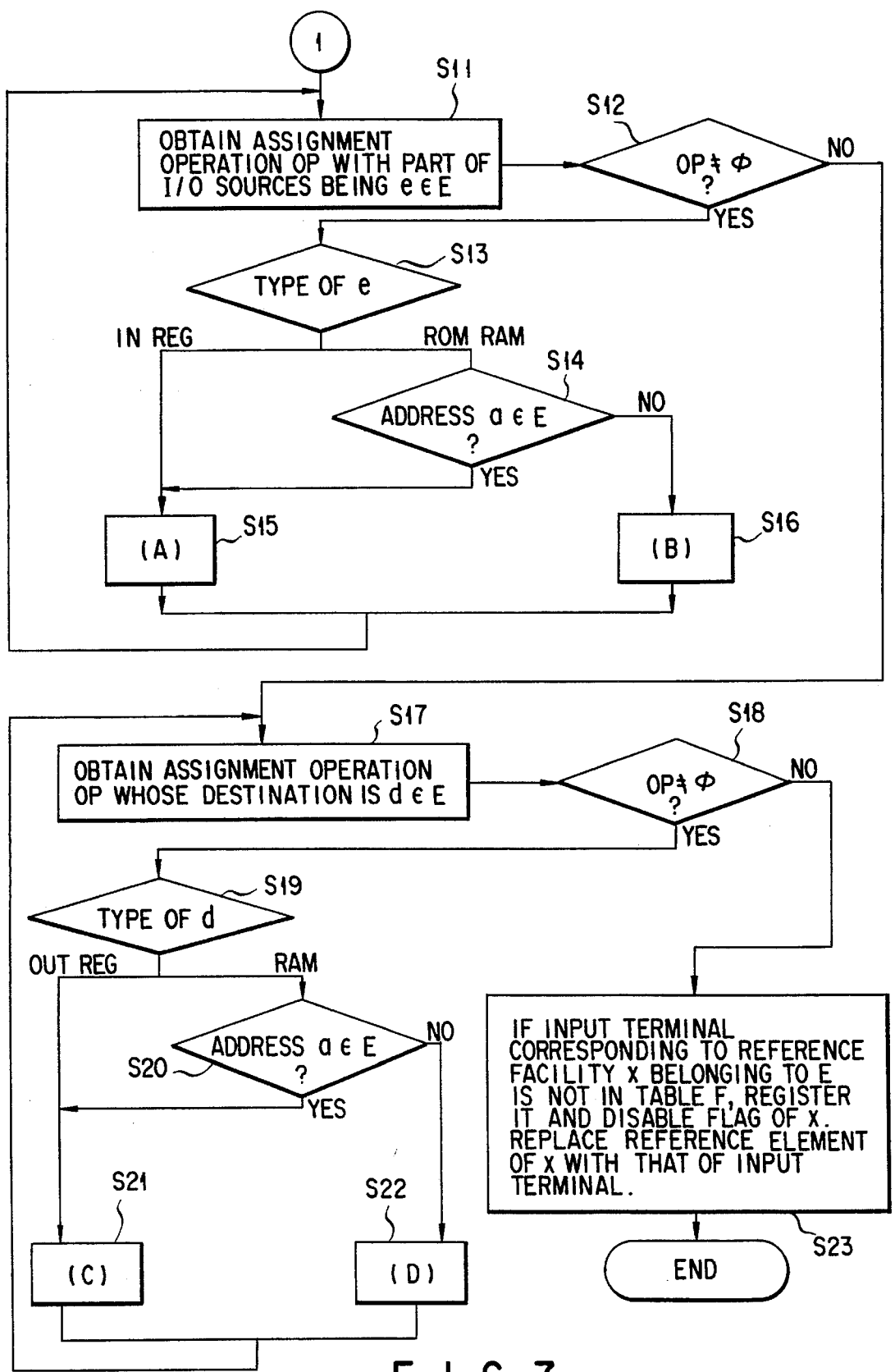
F I G. 7

| RESOURCE NAME | TYPE | msb | lsb | WORD SIZE | FLAG |
|---|---|---|---|---|---|
| CLK | IN | -1 | -1 | -1 | 1 |
| START | IN | -1 | -1 | -1 | 1 |
| SCLR | IN | -1 | -1 | -1 | 1 |
| OUTDAT | OUT | 0 | 15 | -1 | 0 |
| ACC | REG | 0 | 15 | -1 | 0 |
| IR | REG | 0 | 15 | -1 | 0 |
| MAR | REG | 0 | 9 | -1 | 0 |
| LOC | REG | 0 | 9 | -1 | 0 |
| MOC | REG | 0 | 9 | -1 | 0 |
| M | RAM | 0 | 15 | 1024 | 0 |
| C_1 | OUT | -1 | -1 | -1 | 1 |
| C_2 | OUT | -1 | -1 | -1 | 1 |
| C_3 | OUT | -1 | -1 | -1 | 1 |
| C_4 | OUT | -1 | -1 | -1 | 1 |
| C_10 | OUT | 1 | 1 | 1 | 1 |
| IR_IN | IN | 0 | -5 | 1 | 1 |

FIG. 15

```
<INTS> SIMPLE
<IN>  CLK.START. SCLR ;
<OUT> C_1,C_2,C_3,C_4,C_5,
      C_6,C_7,C_8,C_9,C_10 ;
<IN>  IR_IN<0:5>  ;

<STT> CLK ;
 INIT : C_1 = 1 ;
        IF START THEN NEXT ADR ;
                 ELSE NEXT INIT ;
        ENDIF ;
 ADR  : C_2 = 1 ;   C_3 = 1 ;
        NEXT  IFT ;
 IFT  : C_4 = 1 ;
        NEXT DECODE ;
 DECODE :
     CASE  IR_IN<0:5>  OF
         1 :: NEXT AD ;
         2 :: NEXT SB ;
         4 :: NEXT LD ;
         8 :: NEXT STR ;
        16 :: NEXT STR ;
        32 :: NEXT INIT ;
      OTHERS :: NEXT ADR ;
     ENDCASE ;
     C_5 = 1 ;
 AD :
   C_6 = 1 ;
   NEXT  ADR :
 SB :
```

F I G. 16

```
            NEXT DECODE ;
DECODE :
     CASE  IR_IN<0:5>  OF
           1 :: NEXT AD ;
           2 :: NEXT SB ;
           4 :: NEXT LD ;
           8 :: NEXT STR ;
          16 :: NEXT STR ;
          32 :: NEXT INIT ;
      OTHERS :: NEXT ADR ;
     ENDCASE ;
     C_5 = 1 ;
AD :
  C_6 = 1 ;
  NEXT ADR ;
SB :
  C_7 = 1 ;
  NEXT ADR ;
LD :
  C_8 = 1 ;
  NEXT ADR ;
STR :
  C_9 = 1 ;
  NEXT ADR ;
BR :
  C_10 = 1 ;
  NEXT ADR ;
<ENDSTT> ;
<EXC> SCLR : NEXT INIT ;
<ENDEXC> ;
<ENDINTS>;
```

FIG. 17

```
IF C_1  THEN  LOC = 0 ; ENDIF ;
IF C_2  THEN  MAR = LOC ; ENDIF ;
IF C_3  THEN  LOC = LOC + 1 ; ENDIF ;
IF C_4  THEN  IR = M{MAR} ; ENDIF ;
IF C_5  THEN  MAR = IR<6:15> ; ENDIF ;
IF C_6  THEN  ACC = ACC + M{MAR} ; ENDIF ;
IF C_7  THEN  ACC = ACC - M{MAR} ; ENDIF ;
IF C_8  THEN  ACC = M{MAR} ; ENDIF ;
IF C_9  THEN  M{MAR} = ACC ; ENDIF ;
IF C_10 THEN  LOC = IR<6:15> ; ENDIF ;
OUTDAT = ACC ;
```

(TABLE T2)
| MEMORY ADDRESS PAIN | R/W | CONTROL SIGNAL |
|---|---|---|
| ( M , MAR ) | 1 | C_1 |
| ( M , MAR ) | 0 | C_2 |
1 READ
0 WRITE
FIG. 20
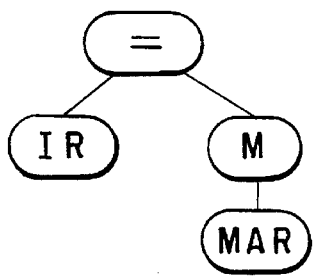
FIG. 21
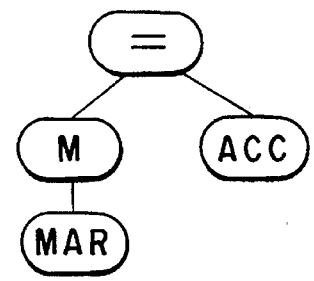
FIG. 23
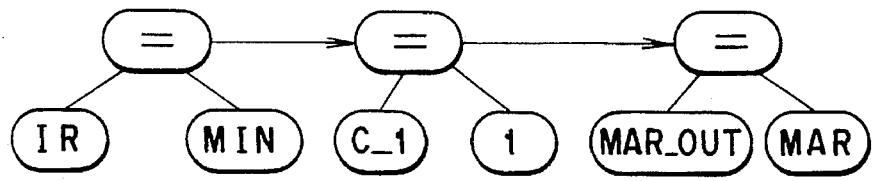
FIG. 22
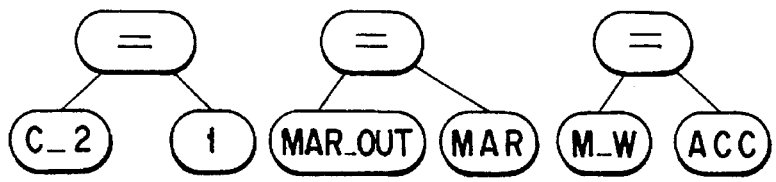
FIG. 24

```
<INTS> SIMPLE ;
<IN>  CLK START. SCLR ;
<OUT> OUTDAT<0:15>     ;
<REG> ACC<0:15>. IR<0:15>.MAR<0.9>. LOC<0.9> ;
<IN>  M_IN<0:15>. C_1. C_2 ;
<OUT> MAR_OUT<0:9>. M_W<0:15>  ;

<STT> CLK :
 INIT : LOC = 0 ;
        IF START THEN NEXT ADR;
                ELSE NEXT INIT ;
        ENDIF ;
 ADR  : MAR = LOC ;   LOC = LOC = 1 ;
        NEXT IFT ;
 IFT  : IR = M_IN ; C_1 = 1 ; MAR_OUT = MAR ;
        NEXT DECODE;
 DECODE :
     CASE  IR<0:5>  OF
          1 :: NEXT AD ;
          2 :: NEXT SB ;
          4 :: NEXT LD ;
          8 :: NEXT STR ;
         16 :: NEXT STR ;
         32 :: NEXT INIT ;
      OTHERS :: NEXT ADR ;
       ENDCASE ;
     MAR = IR<6:15> ;
 AD :
    C_1 = 1 ;  MAR_OUT = MAR ;
    ACC = ACC + M_IN ;
    NEXT ADR ;
 SB :
```

FIG. 25

```
            16 :: NEXT STR ;
            32 :: NEXT INIT ;
        OTHERS :: NEXT ADR ;
          ENDCASE ;
      MAR = IR<6:15> ;
    AD :
      C_1 = 1 ;  MAR_OUT = MAR ;
      ACC = ACC + M_IN ;
      NEXT ADR ;
    SB :
      C_1 = 1 ;  MAR_OUT = MAR ;
      ACC = ACC - M_IN ;
      NEXT ADR ;
    LD :
      C_1 = 1 ;  MAR_OUT = MAR ;
      ACC = M_IN ;
      NEXT ADR ;
    STR :
      C_2 = 1 ;  MAR_OUT = MAR ;  M_W = ACC ;
      NEXT ADR ;
    BR :
      LOC = IR<6:15> ;
      NEXT ADR ;
<ENDSTT> ;
<STC>
    OUTDAT = ACC ;
<ENDSTC> ;
<EXC> SCLR ; NEXT INIT ;
<ENDEXC> ;
<ENDINTS>;
```

FIG. 26

```
<INTS> SIMPLE ;
<IN>  CLK ;
<OUT> OUTDAT <0:15>   ;
<REG> ACC<0:15>, IR<0:15>, MAR<0:9>, LOC <0:9> ;
<RAM> M {1024} <0:15>   ;

<IN>  C_1,C_2,C_3,C_4,C_5,
      C_6,C_7,C_8,C_9,C_10 ;
<OUT> IR_OUT <0:5> ;

<STC>
 BEGIN
 IF C_1  THEN  LOC = 0 ; ENDIF ;
 IF C_2  THEN  MAR = LOC ; ENDIF ;
 IF C_3  THEN  LOC = LOC + 1 ;  ENDIF ;
 IF C_4  THEN   IR = M {MAR} ; ENDIF ;
 IF C_5  THEN  MAR = IR <6:15> ; ENDIF ;
 IF C_6  THEN  ACC = ACC + M {MAR} ; ENDIF ;
 IF C_7  THEN  ACC = ACC - M {MAR} ; ENDIF ;
 IF C_8  THEN  ACC = M {MAR} ; ENDIF ;
 IF C_9  THEN  M {MAR} = ACC ; ENDIF ;
 IF C_10 THEN  LOC = IR <6:15> ; ENDIF ;
 OUTDAT = ACC ;
 IR_OUT = IR <0:5> ;
 END  AT CLK ;
<ENDSTC>;
<ENDINTS>;
```

FIG. 27

(RESOURCE TABLE F)

| RESOURCE NAME | TYPE | msb | lsb | WORD SIZE | FLAG |
|---|---|---|---|---|---|
| CLK | IN | -1 | -1 | -1 | 1 |
| START | IN | -1 | -1 | -1 | 1 |
| SCLR | IN | -1 | -1 | -1 | 1 |
| OUTDAT | OUT | 0 | 5 | -1 | 1 |
| ACC | REG | 0 | 15 | -1 | 2 |
| IR | REG | 0 | 15 | -1 | 1 |
| MAR | REG | 0 | 9 | -1 | 1 |
| LOC | REG | 0 | 9 | -1 | 1 |
| M | RAM | 0 | 15 | 1024 | 0 |
| M_IN | IN | 0 | 15 | -1 | 1 |
| C_1 | OUT | -1 | -1 | -1 | 1 |
| MAR OUT | OUT | 0 | 9 | -1 | 1 |
| C_2 | OUT | -1 | -1 | -1 | 1 |
| M_N | OUT | 0 | 15 | -1 | 1 |

FIG. 28

```
IF C_1 THEN  M_IN = M(MAR_OUT) ; ENDIF ;
IF C_2 THEN  M(MAR_OUT) = M_W ; ENDIF ;
```

FIG. 29

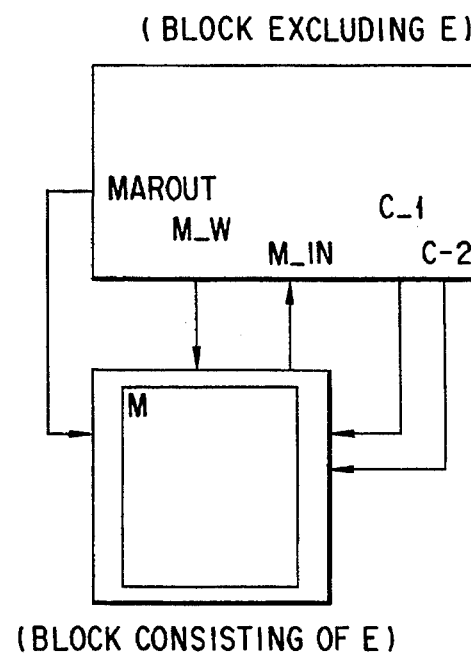
F I G. 30
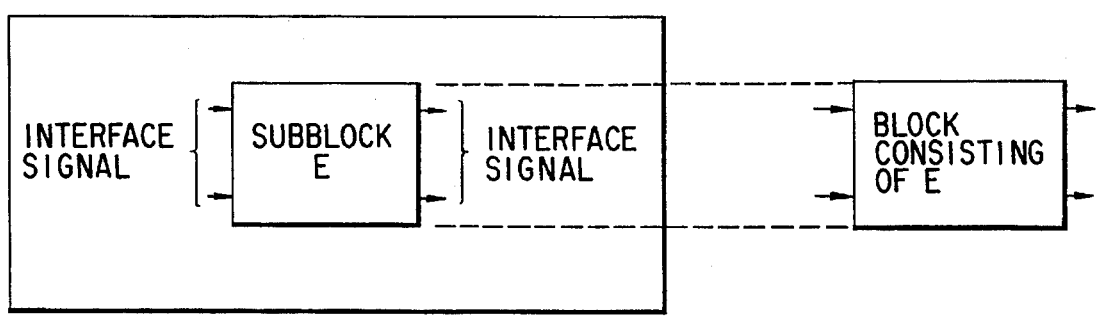
F I G. 31

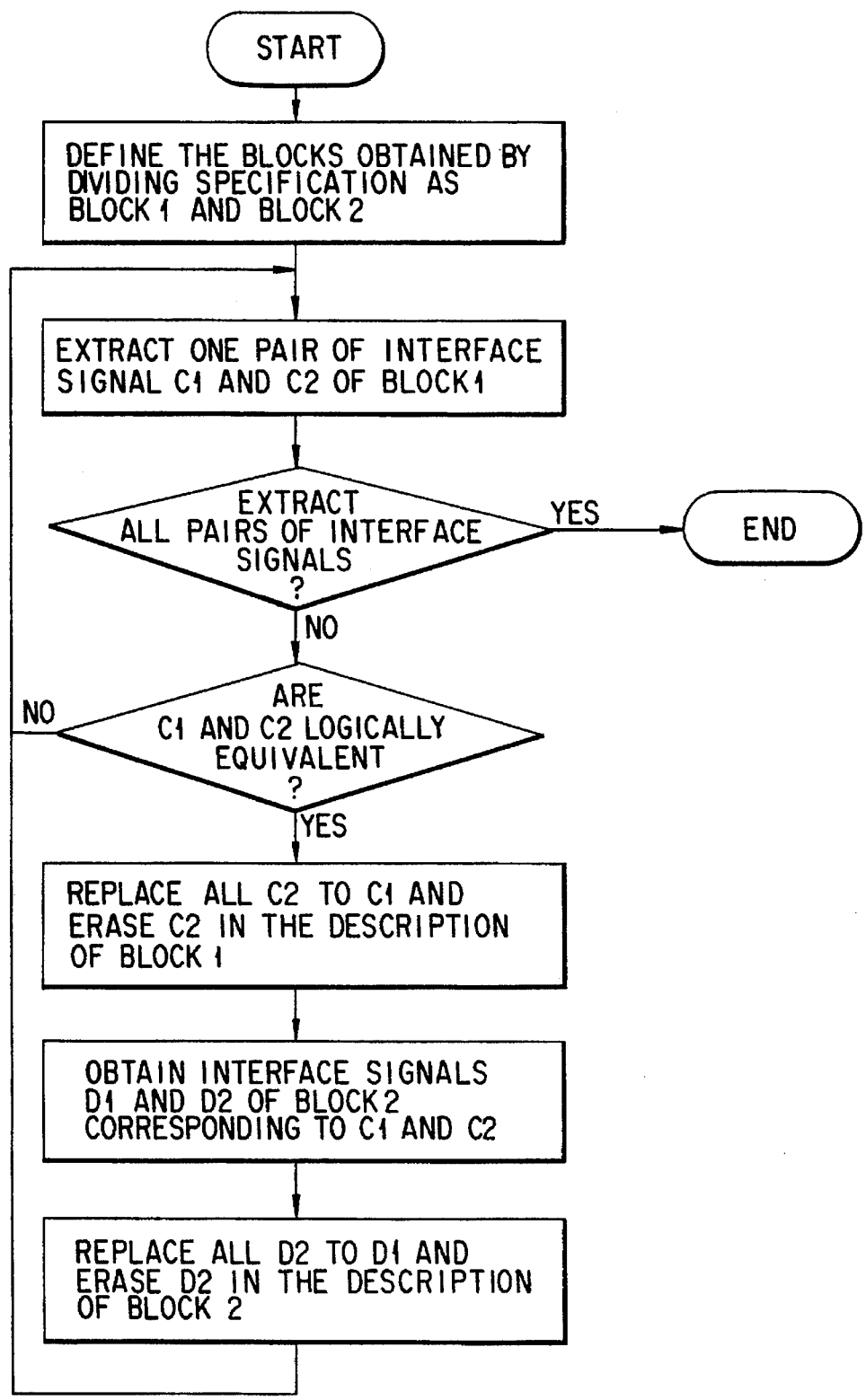
F I G. 32

COMPUTER AIDED HARDWARE DESIGN SUPPORT SYSTEM AND METHOD FOR PROCESSING MANUAL AND AUTOMATIC FUNCTIONAL ELEMENT BLOCKS

BACKGROUND OF THE INVENTION

1. Field of the Invention

The present invention relates to a CAD (Computer Aided Design) system to support designing hardware, and, more particularly, to a design support system with an improved input support function for hardware synthesis system, which runs an operation based on a hardware description input.

2. Description of the Related Art

As the scale of digital systems becomes larger, various CAD systems have been developed to improve the design efficiency to accomplish circuit designs and/or achieve LSI of a designed circuit.

In particular, recently, simulators for validating the functions of hardware to be designed (hereinafter simply referred to as "target hardware"), based on the input functional specification of that hardware, which is described with a hardware description language having a syntax similar to a software programming language, not information on the connection of target circuits, and systems for automatically generating logical circuits (hereinafter called "logic synthesis systems") have been put into practice as systems for supporting the circuit design from the functional design phase.

The "hardware description language" is a language from which a circuit can automatically be generated having functions which match input conditions that are the specifications of inputs, outputs, functions, bit structures, etc. described in a program fashion. Further, it is possible to accomplish mask design for achieving LSI circuits as well as design circuits that realize the intended functions can be designed by processing a hardware description language by a hardware synthesis system.

Designers design intended digital circuits in the following process using a design support system, such as 10 the aforementioned CAD system or logic synthesis system:

(1) First stage: Describe the functional specification of target hardware using a hardware description language.

(2) Second stage: validate the description of the functional specification attained in the first stage using a simulator.

(3) Third stage: Automatically generate a logical circuit by a logic synthesis system using the description of the functional specification which has been examined by the simulator in the second stage.

If what should be input to the logic synthesis system to automatically generate a logical circuit is the whole description of the functional specification written in the first stage, the description in the first stage can be the same as that in the third stage. However, the description of the functional specification in the third stage becomes slightly different from that in the first stage because of the use of the logic synthesis system in the third stage. More specifically, the description for validating the functions in the first stage often differs from the description for logic synthesis in the third stage due to the following reasons.

(1) Logic synthesis system is suited to mainly generate random logic circuit for a control logic, and circuits of a data path, such as arithmetic operational 10 units and memory, can be designed efficiently and to have higher operational speeds if designed manually or a module generator specially designed for those units.

(2) The processing performance of a logic synthesis system is limited, i.e., there is a certain range for the amount of the description in which or the reasonable circuit can be synthesized, or the circuit can be synthesized in the reasonable processing time.

Particularly, since the primary objective of the description in the first stage is to check the function of the overall design target, the description is often written for each large functional block without being conscious of detailed circuit block structures in the logic design.

In dividing the target circuit into blocks, it is necessary to find out all the interface signals between the divided blocks, or all the signal lines through which signals should interface between the divided blocks. The finer the block division becomes, therefore, the more complicated this task becomes. As reference to those interface signals and a description for assigning values to these signals become necessary, the amount of the description of the specifications and the work to provide the description increase. Apparently, this does not meet the objective of the functional validation to "quickly check the basic operations of the whole target circuit based on a abstract specification description (model)". In addition, when the divided blocks become too small, it is difficult to prepare significant (probable) test data for each block.

In view of the above, the following scheme is employed.

First, some of small functional blocks to acquire the intended circuit are treated as a large functional block and a specification for each such large functional block is described. The functions are checked for the specification description of each large functional block as well as the functions of the whole circuit are checked. Then, the specification descriptions of the large functional blocks are manually sorted into blocks which are to be manually designed and those which are to be subjected to logic synthesis in consideration of logic design elements, such as the data path section, control section, logic synthesis section and manually designing section.

Next, the descriptions of the functional specifications of those blocks which belong to the logic synthesis group are also prepared manually. The functional descriptions for validation are manually rewritten into the functional specification descriptions for divided blocks for the logic synthesis group using an editor or the like in the above manner.

Because the functional specifications of a design target are often described twice during the design process as explained above, this design scheme is a bottle-neck in designing an intended circuit using a high level CAD system. The troublesome task of finding out all the interface signals between blocks should also be considered, as described earlier.

In short, in a digital circuit design using the language of describing the functional specification of hardware, a simulator and a logic synthesis system, normally, the functional specification description for checking the general operation (functional specification description for functional validation) should be prepared and simulated, then, the functional specification description for a logic synthesis group, which is the functional specification description for a manual design group excluded from the validated functional specification description, should be prepared again and be subjected to logic synthesis by the logic synthesis system.

The conventional scheme of designing a target circuit, therefore, involves the description of the functional specification for the functional validation and that for the logic synthesis, complicating the overall work. Further, when the functional specification description for logic synthesis is prepared, this description should be validated by a simulator before accomplishing the logic synthesis, resulting in lower productivity.

SUMMARY OF THE INVENTION

It is therefore an object of the present invention to provide a hardware design support system, which can significantly improve the operability by reducing the number of steps of describing the functional specification and checking the functions in designing hardware using a CAD system of a higher level, thereby improving the design efficiency, and a method thereof. More specifically, the present invention aims to provide a hardware design support system, which can select the functional specification description of a block of functional elements (facilities) that belong to manual designing, from the validated functional specification description which is to be used in a processing system for processing the functional specification of the intended hardware described in a hardware description language to automatically generate the hardware of the necessary individual functional elements, and can automatically generate the hardware of the remaining functional elements using an automatic hardware synthesis system.

To achieve the above object, according to one aspect of the present invention, there is provided a hardware design support system for use in a processing system for processing a general functional specification described in a hardware description language to generate intended functional elements, the general functional specification being divided into a functional specification for a first functional element block consisting of first functional elements to be generated by the processing system and a second functional element block consisting of second functional elements to be excluded from the first functional element block for reedition, the hardware design support system comprising:

indication means for indicating one of a first mode inputting an information to specify the second functional elements and a second mode inputting an information to specify the first functional elements;

interface signal generating means for executing one of a first operation which acquires input/output elements from the first functional elements associated with the second functional elements according to the first mode and generates all necessary interface signal information to be exchanged between the first functional element block and the second functional element block, based on the input/output elements and information of the second functional elements, and a second operation which acquires input/output elements from the first functional elements associated with the first functional elements according to the second mode and generates all necessary interface signal information to be exchanged between the second functional element block and the first functional element block, based on the input/output elements and information of the first functional elements; and functional specification dividing means for replacing a description of the second functional elements described in the functional specification to a description using the interface signal information generated by the interface signal generating means to produce a functional specification of the first functional element block.

This hardware design support system may further comprise specification description display means for display the functional specification as a hardware functional specification description in a text form.

The interface signal generating means may include means for assigning an identical interface signal to the same the input/output elements.

The functional specification dividing means may include means for generating, from one port, interface signal information associated with logically the same multiple functional elements.

The functional specification dividing means may include means for replacing descriptions of the first functional elements in the general functional specification to descriptions using the interface signal information and for generating a functional specification of the second functional elements.

The functional specification dividing means may include means for replacing the description of the first functional elements to null operation and adding the descriptions before replacing the description of the first functional elements to null operation to the descriptions of the second functional elements.

The hardware design support system may further comprise a table for storing the input/output elements and the interface signal information generated in association with the input/output elements.

The interface signal generating means may include a table for storing the input/output elements and the interface signal information generated in association with the input/output elements.

According to another aspect of the present invention, there is provided a hardware design support method for use in a processing system for processing a general functional specification described in a hardware description language to generate intended functional elements, the general functional specification being divided into a functional specification for a first functional element block consisting of first functional elements to be generated by the processing system and a second functional element block consisting of second functional elements to be excluded from the first functional element block for reedition, the hardware design support method comprising:

a first step of acquiring one of a first input/output elements associated with the second functional elements and a second input/output elements associated with the first functional elements;

a second step of executing one of a first operation which generates all necessary interface signal information to be exchanged between the first functional element block and the second functional element block, based on the first input/output elements and information of the second functional elements, and a second operation which generates all necessary interface signal information to be exchanged between the second functional element block and the first functional element block, based on the second input/output elements and information of the first functional elements; and a third step of excluding the functional specification of the second functional elements from the general functional specification and receiving the interface signal information generated to produce a functional specification of at least one of the first functional element block and the second functional element block.

The hardware design support system of the present invention can select the functional specification description of a block of functional elements that belong to manual designing, from the validated functional specification description which is to be used in a processing system for processing the functional specification of the intended hardware described in a hardware description language to automatically generate the hardware of the necessary individual functional elements, and can automatically generate the hardware of the remaining functional elements using an automatic hardware synthesis system.

More specifically, by merely specifying the functional elements that belong to manual designing, the validated functional specification description is automatically divided into the functional specification of a block of the specified functional elements and that of a block of the remaining functional elements, and signals (interface signals) that should be exchanged between both blocks are analyzed and extracted, whereby the functional specification of the specified functional elements and that of the remaining functional elements can automatically be generated while reflecting the information of the necessary interface signals on those specifications.

It is therefore possible to provide a hardware design support system, which can significantly improve the operability by reducing the number of steps of describing the functional specification and validation steps, thus improving the design efficiency.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 4 and 5 are diagrams exemplifying the functional specification description used in the present system;

FIG. 6 presents processing flows in an input/output (I/O) source analyzer, an interface signal generator and a functional specification divider in the present system;

FIG. 7 is a flowchart illustrating the contents of processing following the connector 1 in the flowchart in FIG. 6;

FIG. 15 is a diagram of a tree structure showing a resource table F acquired after executing a command line input "% exclude OUTDAT, ACC, IR, MAR, LOC, M" according to this embodiment of the present invention;

FIGS. 16 and 17 are diagrams exemplifying the description of a functional specification for generating a block which is acquired by excluding facilities E specified by a command line input "% exclude OUTDAT, ACC, IR, MAR, LOC, M" (the description being used in logic synthesis) according to this embodiment of the present invention;

FIG. 20 is a diagram showing an example of a table T2 for storing interface signals generated when I/O sources in an assignment operation are RAM and ROM according to this embodiment of the present invention;

FIG. 21 is a diagram showing a tree structure in a functional specification storage corresponding to an assignment statement IR =M{MAR} according to this embodiment of the present invention;

FIG. 22 is a diagram showing a tree structure corresponding to a table T2 (FIG. 20) after execution of a command "% exclude M" in a facility indicator according to this embodiment of the present invention;

FIG. 23 is a diagram showing a tree structure in the functional specification storage corresponding to an assignment statement M{MAR}=ACC according to this embodiment of the present invention;

FIG. 24 is a diagram showing a tree structure corresponding to FIG. 22 after execution of a command "% exclude M" in the facility indicator according to this embodiment of the present invention;

FIGS. 25 and 26 are diagrams exemplifying the description of a functional specification for generating a block which is acquired by excluding facilities E specified by a command "% exclude M" in the facility indicator according to this embodiment of the present invention;

FIG. 27 is a diagram exemplifying the description of a functional specification for generating a block which consists of facilities E specified by the facility indicator according to this embodiment of the present invention;

FIG. 28 is a diagram showing an example of a resource table F after executing a command "% exclude M" in the facility indicator according to this embodiment of the present invention;

FIG. 29 is a diagram illustrating the description of the functional specification of a block consisting of facilities E specified by a command "% exclude M" in the facility indicator according to this embodiment of the present invention;

FIG. 30 is a conceptual diagram of division by a command "% exclude M" in the facility indicator according to this embodiment of the present invention;

FIG. 31 is a diagram illustrating the concept of division by for generating a hierarchical structure according to another embodiment of the present invention; and FIG. 32 is a flowchart illustrating an embodiment of optimization of interface signals by functional specification dividing means.

DETAILED DESCRIPTION OF THE PREFERRED EMBODIMENTS

One preferred embodiment of the present invention will now be described referring to the accompanying drawings.

Figures 1, 2:
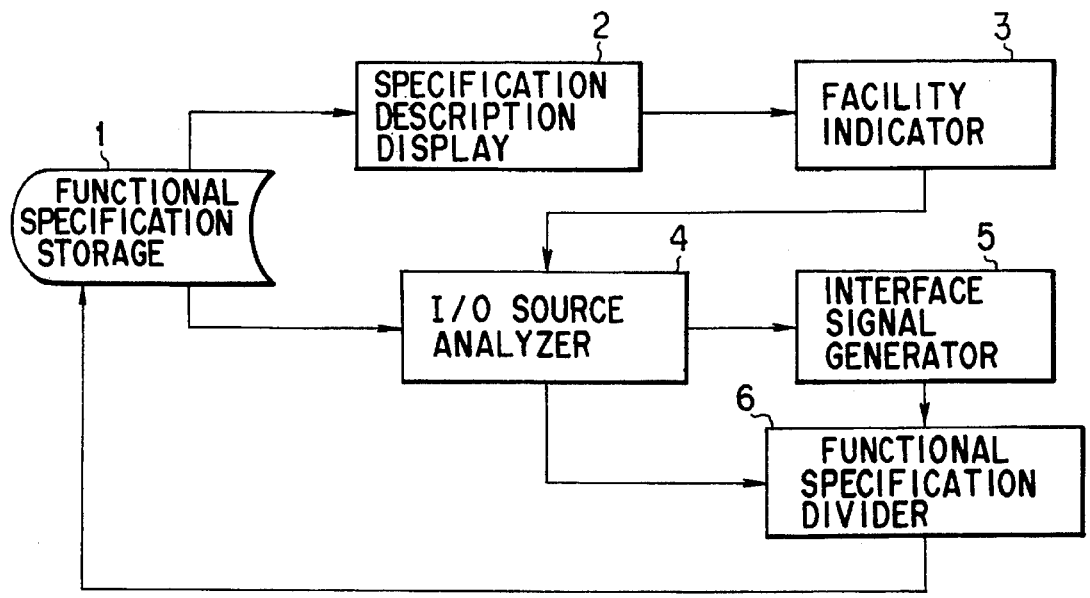
FIG. 1 is a block diagram illustrating the structure of a hardware design support system according to one embodiment of the present invention.
FIG. 2 is a diagram exemplifying the structure of a resource table F used in the present system.
Figure 3:
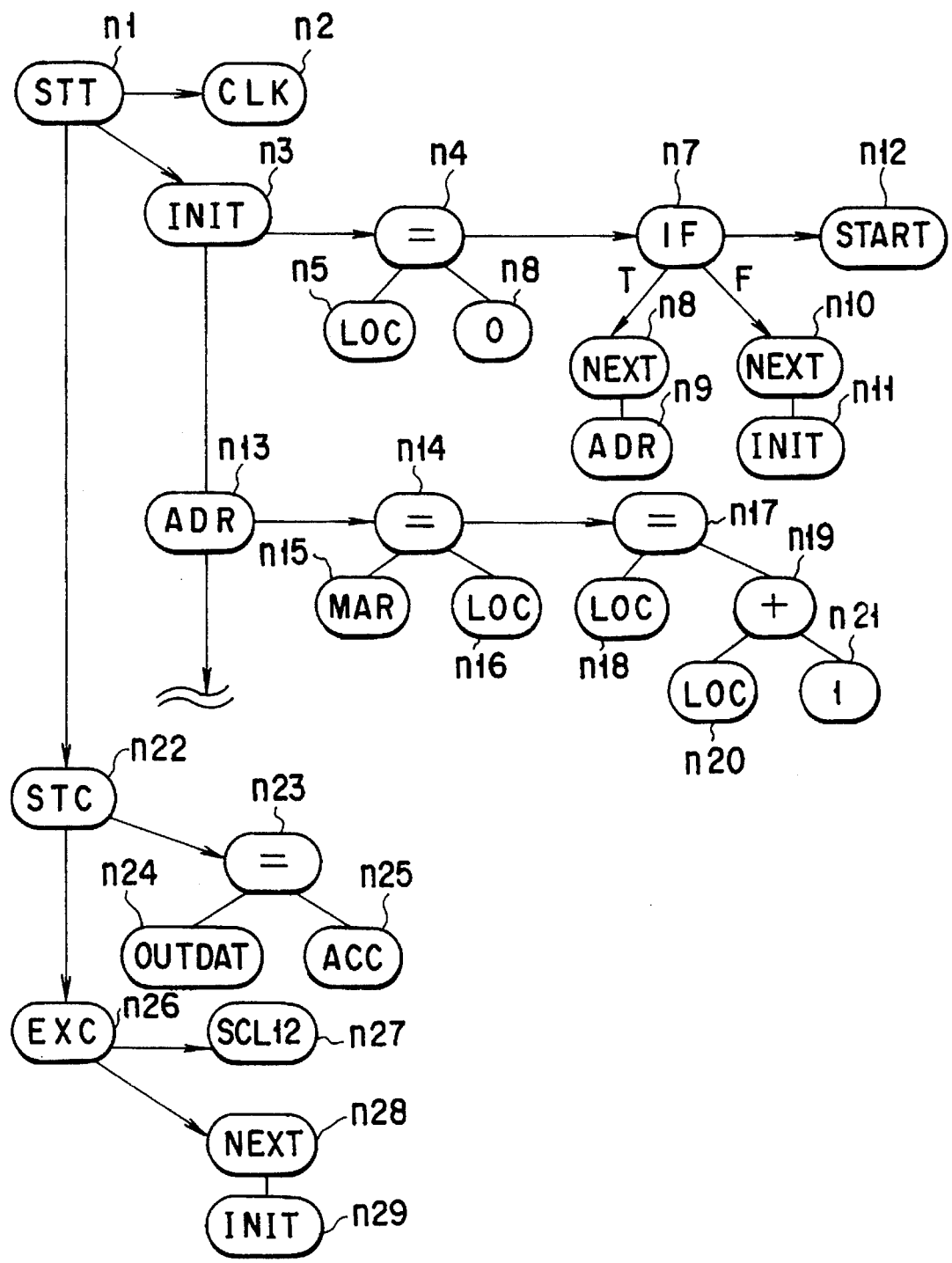
FIG. 3 is a diagram showing one example of a tree structure representing a functional specification in a functional specification storage used in the present system.

FIG. 1 presents a block diagram illustrating the structure of a hardware design support system according to one embodiment of the present invention. FIG. 2 is a diagram exemplifying the structure of a resource table F used in this system. FIG. 3 is a diagram showing one example of a tree structure representing a functional specification in a functional specification storage used in this system. FIGS. 4 and 5 are diagrams exemplifying the functional specification description used in this system. FIG. 5 shows the continuation of FIG. 4, partially overlapping the latter.

Referring to FIG. 1, the present system comprises a functional specification storage 1, a specification description display 2, a facility indicator 3, an input/output (I/O) source analyzer 4, an interface signal generator 5 and a functional specification divider 6.

The functional specification storage 1 stores the functional specification of hardware to be designed in the form of a resource table F in the format shown in FIG. 2 and a tree structure in FIG. 3 which corresponds to the functional specification description of the hardware. In other words, the functional specification storage 1 stores information of the functional specification of the target hardware by resolving the functional contents into a tree structure based on the functional specification description shown in FIGS. 4 and 5.

The specification description display 2 displays the functional specification stored in the functional specification storage 1 on a display unit as a hardware functional description in a text form shown in FIGS. 4 and 5.

The facility indicator 3 corresponds to an input operation section, such as a keyboard, and specifies facilities (hardware resources; hardware functional elements), such as registers appearing in the functional description displayed by the specification description display 2.

The I/O source analyzer 4 analyzes that functional specification among the functional specification stored in the functional specification storage 1 which involves facilities specified by the facility indicator 3 as I/O sources.

Given that the functional specification stored in the functional specification storage 1 is separated into the functional specification of a block consisting of the facilities indicated by the facility indicator 3 and that of a block excluding the indicated facilities, the interface signal generator 5 discriminates and extracts interface signals, which should be exchanged between those two blocks or signal lines for signal exchange therebetween, based on the results of the analysis conducted by the I/O source analyzer 4.

The functional specification divider 6 generates a functional specification of each of the two blocks as a single unit, using the results of the analysis done by the I/O source analyzer 4 and information about the signal lines determined by the interface signal generator 5.

The operation of the system according to this embodiment will be described with reference to the case 10 where the functional specification expressed by the functional description shown in FIGS. 4 and 5 is stored in the functional specification storage 1.

The functional description in FIGS. 4 and 5 is a description of register transfer level.

The 1st to 5th lines in the functional specification description in FIG. 4 declare module names and facilities included in modules (declarative part).

"IN" on the second line denotes input terminals, "OUT" on the third line are output terminals, "REG" on the 4th line are registers (flip-flops), and "RAM" on the 5th line represents a memory.

Symbols "<" and ">" appearing on the 3rd to 5th lines indicate reference elements. The integers within the symbols "<" and ">" represent msb (Most Significant Bit) and lsb (Least Significant Bit) of a facility; for example, "<0: 15>" indicates that a 16-bit structure from 0 (msb) to 15 (lsb).

"{1024}" on the 5th line indicates the word size of the memory, which is 1024 words in this case.

The 6th to 46th lines a functional description part that represents the actual functional specification. The 6th to 41st lines represents a description for state machine, with a label, such as "INIT" or "ADR", added to a statement representing one state name while the description following the label represents the operation in that state.

The "NEXT" statement appearing on the 8th line, etc., represents state transition. The 42nd to 46th lines in FIG. 5 represent an operation that is executed in every clock cycle.

The functional specification storage 1 stores the contents of the functional description given in FIGS. 4 and 5 in the form of the resource table F shown in FIG. 2 and the tree structure in FIG. 3 which corresponds to the functional description part.

In the resource table F in FIG. 2 are registered "resource names", "types", "msb", "lsb", "word size", and "flags." That is, the resource table F consists of the resource names in modules, their types, msb, lsb, word size and flags which indicate whether or not registered entries are valid (valid if "1"). "−1" in the resource table F in FIG. 2 indicates that the associated item has no attribute.

In the tree structure in FIG. 3, those portions encircled by ellipses indicate nodes, and a symbol or a string of characters in each node represents the type or variable name of that node. Those nodes which contain operators, such as "+" (add), "−" (subtract) and "=" (assignment), and control statements, such as "IF", "CASE" and "NEXT" are called "operator nodes", while those containing variable names are called "variable nodes". "SAT", "STC", "EXC", and the like are names given to blocks which indicate functional circuits (functional elements) including different control method, and nodes containing those names are called "block nodes".

A description will now be given of the case where a designer separates outputs OUTDAT of registers, memory and ACC (accumulator) in a module from the functional description given in FIGS. 4 and 5 and obtains the description of a control logic section of those resources.

The designer operates a keyboard in the facility indicator 3 to enter a command line input "% exclude OUTDAT, ACC, IR, MAR, LOC, M" and executes this command to specify facilities to be separated.

"%" in this command line input is a prompt indicating that an input can be made, so that the actual key-in would be "exclude OUTDAT, ACC, IR, MAR, LOC, M". The entered command instructs separation of the block functional specification expressed by the functional description as shown in FIGS. 4 and 5 (FIG. 5 shows the continuation of FIG. 4) into the functional specification of a block consisting of operands, OUTDAT, ACC, IR, MAR, LOC and M, and the functional specification of a block excluding those facilities.

As described earlier, in the functional specification storage 1 is stored a tree structure as shown in FIG. 3, which represents a functional specification acquired by processing, in a hardware description language, a functional description as shown in FIGS. 4 and 5 or the contents of the target hardware given by the designer. The I/O source analyzer 4 detects assignment operations with I/O sources being the facilities specified by the operand in the command "% exclude OUTDAT, ACC, IR, MAR, LOC, M" from the functional information (FIG. 3) with the tree structure stored in the functional specification storage 1.

The above command instructs to exclude the facilities described in the operand, "OUTDAT" (output data), "ACC" (accumulator), "IR" (instruction register), "MAR" (memory address register), "LOC" (location counter), and "M" (memory). In other words, this command specifies and excludes the memory and the registers, so that, from this command, the I/O source analyzer 4 detects the node "=", an assignment operation, from the functional information with the tree structure as shown in FIG. 3, stored in the functional specification storage 1.

The operation characterizing the memory and the registers is an assignment operation; the registers are described on a line labeled with "<REG>" that indicates the attribute of a register element while the memory is described on a line labeled with "<RAM>" that indicates the attribute of a memory element. Therefore, the facilities to be excluded, "OUTDAT" (output data), "ACC" (accumulator), "IR" (instruction register), "MAR" (memory address register), "LOC" (location counter), and "M" (memory), can be recognized mainly as the memory and register portion.

If the analyzing function of the I/O source analyzer 4 is designed in such a way as to search for an assignment operation when the exclusion targets include memory or register, the I/O source analyzer 4 can be made to detect a node "=" indicating an assignment operation first. The I/O source analyzer 4 detects this assignment operation and determines whether or not the assignment operation involves the facilities to be excluded, and register them in a table if they are the exclusion targets, so that the facilities can be separated into the exclusion targets and the other.

Given that the functional specification stored in the blocks expressed by the functional description in FIG. 4 are separated into two blocks, the first block consisting only of the facilities to be excluded and the second consisting of the remaining facilities other than the excluding facilities, the interface signal generator 5 extracts all the interface signals between those blocks (the signals which should be exchanged between the divided blocks), based on the results of the analysis conducted by the I/O source analyzer 4.

FIGS. 6 through 11 illustrate the algorithm of the present system.

Figure 8:
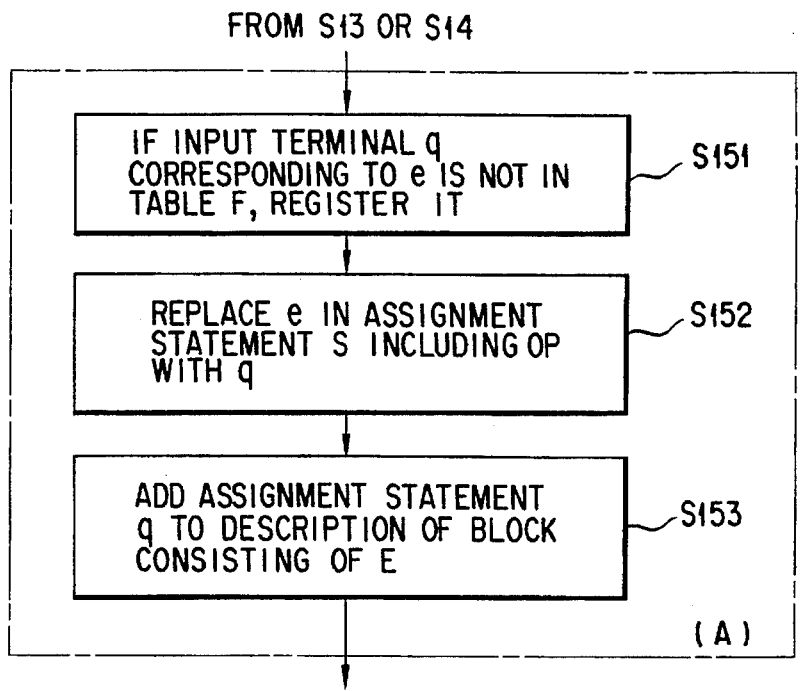
FIG. 8 is a flowchart illustrating the contents of step S15 in the flowchart in FIG. 7.
Figure 9:
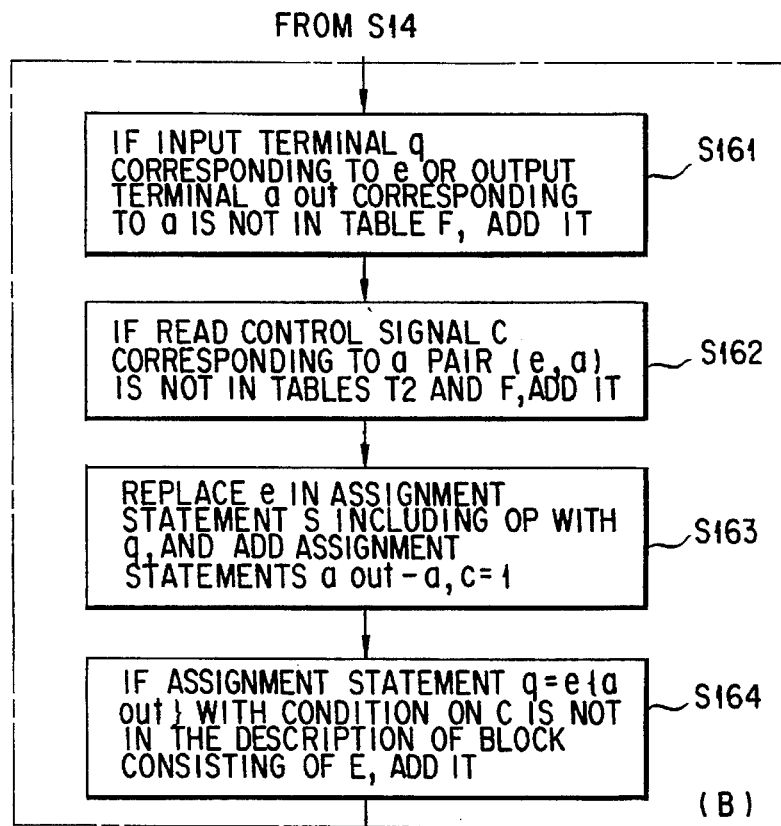
FIG. 9 is a flowchart illustrating the contents of step S16 in the flowchart in FIG. 7.
Figure 10:
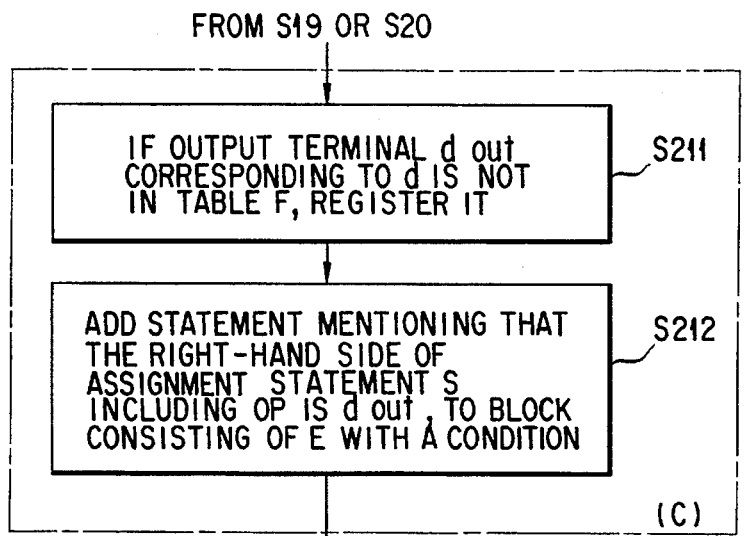
FIG. 10 is a flowchart illustrating the contents of step S21 in the flowchart in FIG. 7.
Figure 11:
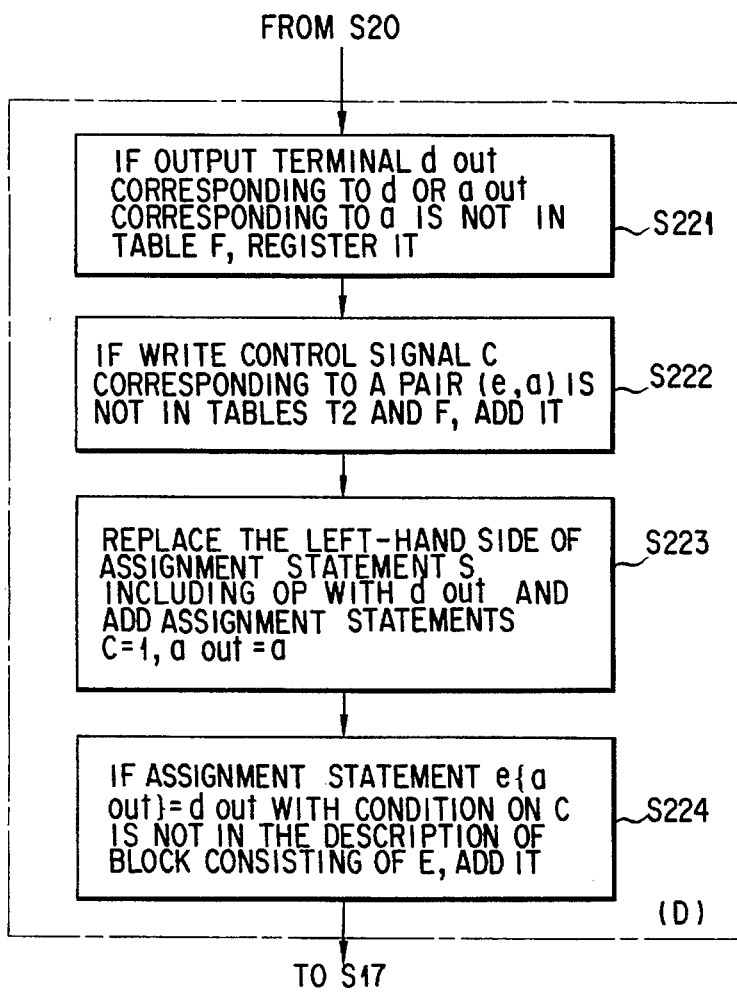
FIG. 11 is a flowchart illustrating the contents of step S22 in the flowchart in FIG. 7.

FIG. 6 presents processing flows in the I/O source analyzer 4, the interface signal generator 5 and the functional specification divider 6 in the present system. FIG. 7 is a flowchart illustrating the contents of processing following the connector 1 in the flowchart in FIG. 6 (S11 to S23). FIG. 8 is a flowchart illustrating the contents of step S15 in the flowchart in FIG. 7. FIG. 9 is a flowchart illustrating the contents of step S16 in the flowchart in FIG. 7. FIG. 10 is a flowchart illustrating the contents of step S21 in the flowchart in FIG. 7. FIG. 11 is a flowchart illustrating the contents of step S22 in the flowchart in FIG. 7.

Figures 12, 13:
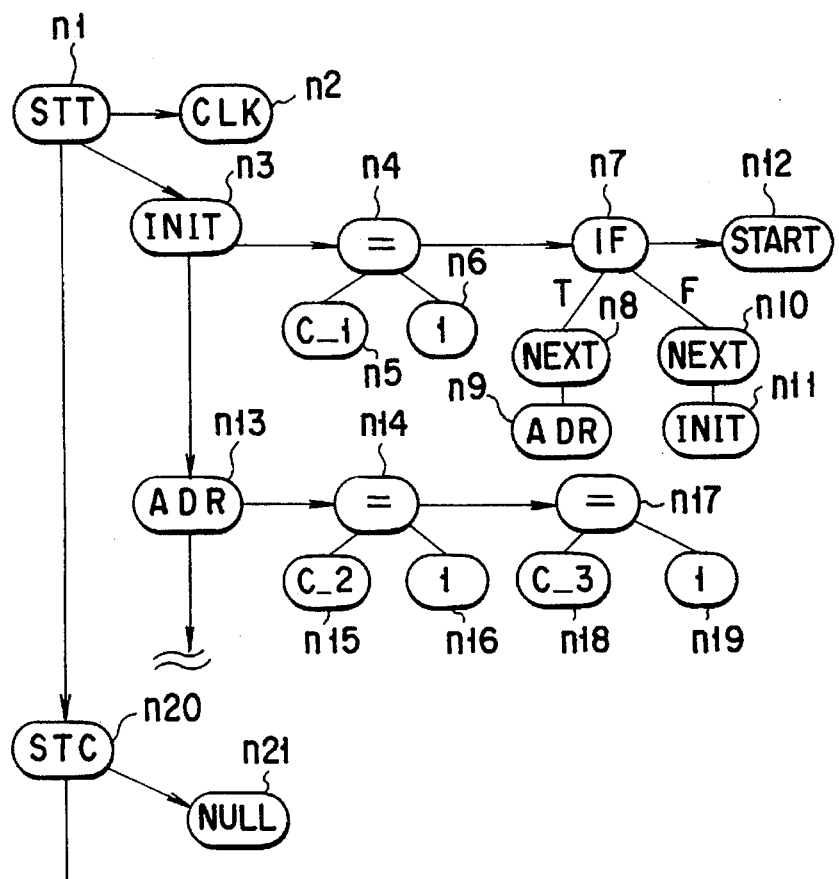
FIG. 12 is a diagram showing an example of a table T for storing interface signals generated in association with I/O sources of an assignment operation used in the present system.
FIG. 13 is a diagram of a tree structure representing the functional specification of a block which is acquired by excluding facilities specified by a command line input "% exclude OUTDAT, ACC, IR, MAR, LOC, M" according to this embodiment of the present invention.

In the algorithm in FIGS. 6 to 11 is used a table T as shown in FIG. 12, which stores the I/O sources of an assignment operation ("=") and interface signals (control signals) produced in association therewith.

In step S1, an assignment operation OP with I/O sources all being E (which indicates facilities (functional elements) to be excluded) or belonging to numerals is obtained. The facilities E to be excluded here are expressed as E={OUTDAT, ACC, IR, MAR, LOC, M}.

Step S1 has a function to trace the tree structure in FIG. 3 representing the functional specification in the order of node numbers, and the process is executed in the functional specification storage 1. In this case, an operation of a node n4 is acquired as the operation OP, and the flow advances to the subsequent steps S2 and S3.

Since the node n4 belongs to "<SAT>", a state machine, and it thus belongs to the branches of a node n1 or is included in the node n1, and has an execute condition, the decision in step S3 becomes "YES", causing the flow to advance to step S4. In step S4, it is discriminated whether the table contains a list of the I/O sources. If the table T does not contain such a list, the flow moves to step S5 where a transfer control signal corresponding to the I/O sources is generated and is registered in the table T and resource table F.

In other words, when the I/O sources are not in the table T, the output of the operation of the node n4, a list of the I/O sources "1=(LOC, (0))", and a signal name "C_1" as the name of the control signal corresponding to this list are registered in the table T.

Let "C_1", "C_2", . . . be the names of control signals generated in order.

when the process in step S5 is complete or when a list of the I/O sources is found in the table T in step S4, the flow advances to step S6. In step S6, a partial tree having the node n4 as its root is replaced with a tree representing the assignment statement "C_1=1". The flow further moves to step S7 where

IF C_1 THEN LOC=0; ENDIF;

generated as the description of the block consisting of the facilities E to be excluded. For the block consisting of the facilities E to be excluded, C_1 becomes an input signal (terminal).

Then, the flow returns to step S1 and the same processing as explained above is executed for the next operation OP. In this embodiment, there are n14 and n17 as nodes of an assignment operation OP (nodes with OP being "="), the same processing is performed for the node n14 first and then for the node n17.

In the case of the node n17 whose assignment operation OP is an operator "=" ( assignment ), there are two I/O sources "LOC" and "1" as indicated by (LOC, 1), the I/O sources are registered in the table T as "1=(LOC, (LOC, 1))" in step S4.

Figure 14:
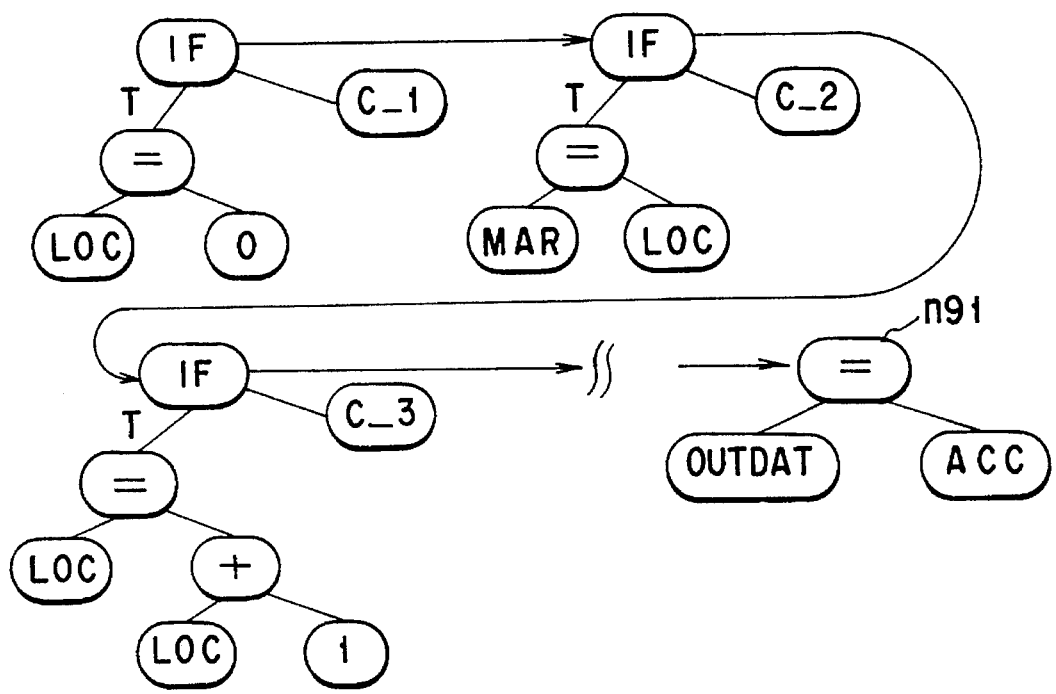
FIG. 14 is a diagram of a tree structure representing the functional specification of a block which is specified by a command line input "% exclude OUTDAT, ACC, IR, MAR, LOC, M" according to this embodiment of the present invention.

FIG. 12 illustrates the contents of the table T, and FIGS. 13 and 14 respectively illustrate a tree structure representing the block consisting of those facilities without the facilities E to be excluded and a tree structure representing the block consisting of those facilities E.

Through execution of similar processing, a node n23 having an operation OP of "=" is finally attained in step S1. What the assignment operator does in this case is to assignment "ACC" to "OUTDAT". Since this operation OP does not belong to a state machine "STT", the decision in step S3 becomes "NO" and nothing will be registered in the table T, causing the flow to advance to steps S8 and S9. In step S8, an assignment statement s including the operation of the node n23 is replaced with a null statement. In step S9, this null statement s is added to the description of the block consisting of the facilities E to be excluded.

FIG. 13 illustrates a new tree structure acquired by the above assignment; the node 21 represents the blank statement s produced in step S8. A partial tree having a node 91 in FIG. 14 as its root represents a statement s produced in step S9.

All the operations OP which satisfy the condition of step S1 are obtained in the above manner. Then, the decision in step S2 asking if there is an operation OP that has not been searched becomes "NO", causing the flow to move to step S11.

Step S11 is a routine to acquire an assignment operation OP for input sources part of which, e, is an element of a set of the facilities E to be excluded. Step S12 is a routine to determine if there is this assignment operation OP. In this embodiment, since there is no operation OP that satisfies the condition in step S12 as a result of the execution of step S11, the flow advances to step S17. In step S17, an assignment operation OP whose destination d is an element of a set of the facilities E to be excluded is obtained.

In step S18 it is discriminated whether this assignment operation OP is present. The decision in step S18 also becomes "NO" in this embodiment, so that the flow advances to step S23. As the facility "IR" belonging to the facilities E is referred to on the 16th line in the functional description in FIGS. 4 and 5, an input terminal "IR_IN" corresponding to this facility is registered in the resource table F, and "IR<0:5>", a reference element of "IR", is replaced with "IR_IN<0:5>" in the tree structure of the block consisting of other facilities than the facilities E to be excluded.

The results of such processing are illustrated in FIGS. 16 and 17; FIG. 17 shows the remaining portion of FIG. 16, partially overlapping the latter.

Through the above processing, the resource table F shown in FIG. 15, the tree structure of the block consisting of the facilities E to be excluded, as shown in FIG. 13, and the tree structure of the block consisting of other facilities than the facilities E to be excluded, as shown in FIG. 14, are stored in the functional specification storage 1. FIGS. 16 and 17 illustrate the results of displaying the functional description of the block consisting of other facilities than the facilities E to be excluded by the specification description display 2.

In the functional description in FIGS. 16 and 17, no operations concerning the excluding facilities E indicated by the facility indicator 3 appear and signals "C_1" to "C_10" for controlling those operations are set ON (i.e., the flags are set to "1") instead. The reference of "IR" is replaced with a reference of the input terminal "IR_IN".

Figures 18, 19:
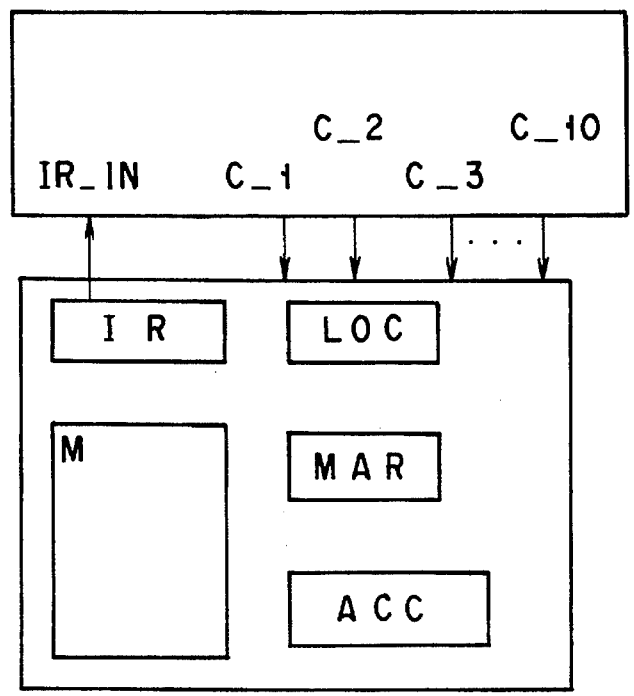
FIG. 18 is a diagram exemplifying the description of a functional specification for generating a block which is acquired by excluding facilities E specified by a command line input "% exclude OUTDAT, ACC, IR, MAR, LOC, M" (document for manual design) according to this embodiment of the present invention.
FIG. 19 is a conceptual diagram of division by a command line input "% exclude OUTDAT, ACC, IR, MAR, LOC, M" according to this embodiment of the present invention.

FIG. 18 illustrates the results of displaying the functional description of the block consisting of the facilities E to be excluded by the specification description display 2.

In the above manner, the functional description shown in FIGS. 4 and 5 can be separated into the specification (FIG. 18) of the block consisting of registers and memory and the specification (FIGS. 16 and 17) of a logic block for mainly controlling those facilities through the signals "C_1" to "C_10" and "IR_IN" produced by the interface signal generator 5. This relation is shown in FIG. 19.

Accordingly, the description of the block of the control system as shown in FIGS. 16 and 17 and the description in FIG. 18 can be used for different purposes; for example, the former is used for an input of the logic synthesis tool while the latter is used for a document (specification) for an input design.

In the above-described example, there is no case where only one of the facilities on both sides of an operation in the description belongs to the facilities E to be excluded, and the decisions in steps S12 and S18 are "NO".

The following will discuss the case where those decisions become "YES".

Let us consider the case where the functional description in FIGS. 4 and 5 is separated into the description of memory "M" and that of the other portions.

In this case, a designer input a command "% exclude M" through the facility indicator 3 to specify the facility "M" to be separated. If part of the I/O sources of an assignment operation ("=") has an attribute of "RAM" or "ROM" in steps S16 and S22, a table T2 that stores information of the interface signals produced in association therewith (signal lines subjected to signal exchange). This table T2 is structured as shown in FIG. 20, and "pair of memory and addresses", "R/W (read/write)", "control signal name", etc., are to be registered there.

First, the facility E to be excluded is "E={M}" in FIG. 6. Since there is no assignment operation OP with I/O sources all belonging to the excluding facility E in the description in FIGS. 4 and 5, the decision in step S2 becomes "NO", causing the flow to advance to step S11. In step S11, "IR=M{MAR}", an assignment operation OP on the 13th line in FIG. 4 is obtained as an operation having an input source of "M". FIG. 21 illustrates the tree structure corresponding to this portion in the functional specification storage 1. The description, "IR=M{MAR}" means that the contents of the address of the memory "M" indicated by the value within the large brackets "{"and "}" or the address "MAR" should be assigned to the instruction register "IR".

Step S11 is a routine to acquire an assignment operation OP for input sources part of which, e, is an element of a set of the facilities E to be excluded. Step S12 is a routine to determine if there is this assignment operation OP. In this case, since there is an operation OP that satisfies the condition in step S12 as a result of the execution of step S11, the flow advances to step S13.

Step S13 is a discrimination routine to select the proper processing depending on the type of the above e. In this case, since the type (or attribute) of part of the input source, e (i.e., resource name "M"), is "RAM", the flow advances to step S14.

It is determined in step S14 whether the address a is included in a set of the facilities E to be excluded. If the decision is affirmative, the flow moves to step S15; and if the decision is negative, the flow advances to step S16. Since the address is "MAR" which is not included in a set of the excluding facilities E, the flow advances to step S16.

The detailed contents of step S15 are illustrated in FIG. 8. In step S151 in FIG. 8, if an input terminal q corresponding to the aforementioned e is not in the table F, it is registered in this table F and e in the assignment statement s including the operation OP is replaced with the input terminal q (S152), the assignment statement q=e is added to the description of the block consisting of the facilities E to be excluded (S153), and then the flow returns to step S11.

The detailed contents of step S16 are illustrated in FIG. 8. In step S161 in FIG. 9, if an input terminal q corresponding to the part of the input sources, e, and an output terminal a_out corresponding to the address a are not in the table F, they are added in this table F.

In this embodiment, the part of the input sources, e, is equivalent to "M", the input terminal q corresponding to e is equivalent to "M_IN", the address a is equivalent to "MAR", and the output terminal corresponding to a is equivalent to "MAR_OUT". As the address a is "MAR" which has an attribute of "REG" (register) and does not correspond to an excluding facility E targeted for memory, it is determined in step S14 that the address a is not included in E, causing the flow to move to step S16.

Step S161 in step S16 adds the input terminal q corresponding to the part of the input sources, e, and the output terminal a_out corresponding to the address a to the table F if they are not in the table F. In this embodiment, therefore, the input terminal "M_IN" corresponding to "M" and the output terminal "MAR_OUT" corresponding to the address "MAR" are registered in the resource table F in FIG. 15.

In the next step S162, a read control signal "C_1" corresponding to a pair of memory and address "(M, MAR)" is registered in the I/O source table T2 (FIG. 20) and the resource table F (FIG. 15). Then, the original assignment statement "IR =M{MAR}" is replaced with three statements "IR=M_IN; C_1=1; MAR_OUT=MAR;" using the terminals produced in steps S161 and S162. The tree structure in the case of this assignment is shown in FIG. 22. In step S164, "IF C_1 THEN M_IN=M{MAR_OUT}; ENDIF;" is added as the description of the block consisting of the facilities E to be excluded.

In the block consisting of the facilities E to be excluded, "C_1" and "MAR_OUT" are input signals ( terminals ), and "M_IN" is an output signal (terminal). Likewise, assignment operations on the 27th, 30th and 33rd lines, which have "M{MAR}" in the functional description in FIGS. 4 and 5 as an input source are obtained in step S11, and a sequence of steps S13 to S16 is repeatedly executed.

At this time, since the read control signal "C_1" corresponding to the memory reference "M{MAR}", the memory data input terminal "M_IN" and the address data output terminal "MAR_OUT" have already been generated, there will not be a new addition made to the tables in steps S161 and S162.

When the above processing is complete, the flow advances to step S17 where an assignment operation whose destination d is an element of a set of the excluding facilities E. In this embodiment, therefore, an assignment operation for writing to the memory "M" is searched in step S17 and the assignment operation on the 36th line (line number of 36) in FIG. 5 is acquired. FIG. 23 illustrates the tree structure corresponding to this portion in the functional specification storage 1.

Then, the flow advances to step S18 where it is discriminated whether the number of assignment operations acquired in step S17 is zero. If it is zero, the flow advances to step S23; and if it is not zero, the flow advances to step S19. Since the decision in step S18 is "YES" (not zero) in this embodiment, the flow advances to step S19 to discriminate the type of the destination d. If the type of the destination d is "OUT" (output) or "REG" (register) in step S19, the flow advances to step S21; and if that type is "RAM" (memory), the flow advances to step S20.

Since the type of "M" is "RAM" in this embodiment, the flow moves to step S20. This step S20 is a routine to discriminate whether the address a is an element of a set of the facilities E to be excluded. If the address a is an element of a set of E, the flow advances to step S21; and if it is not so, the flow advances to step S22. As the address a is "MAR" whose type is "REG" (register) as apparent from the resource table F. Therefore, the address a is not an element of a set of E targeted for the memory "M", so that the flow advances to step S22.

The details of step S22 in FIG. 7 are shown in FIG. 11. As illustrated, the process of step S221 is executed first. This process is to register an output terminal d_out corresponding to the substitution destination d or the output terminal a_out corresponding to the address a in the table F if such is not in this table.

Since the destination d is "M" and data representing that the output terminal d_out is "M_W" has not been registered in the table F, the data output terminal "M_W" for the memory "M" is registered in the table F. As the output terminal "MAR_OUT" corresponding to the address "MAR" has already been registered in that table, it will not be newly generated.

When the process of step S221 is complete, the flow advances to step S22 where a write control signal C for the pair (e, a) is added to the tables T2 and F if it is not in those tables. Since (M, MAR), a pair of the memory and address, has not been registered yet in this stage, a write control signal "C_2" corresponding to this pair is registered in the table T2 and resource table F.

When this process is complete, the flow moves to step S223 where the original assignment statement "M{MAR}= ACC" is replaced with three assignment statements "C_2= 1; MAR_OUT=MAR; M_W=ACC;". The tree structure corresponding to those three statements is illustrated in FIG. 24.

The flow then moves to step S224 where "IF C_2 THEN M{MAR_OUT}=M_W; ENDIF;" is added as the description of the block consisting of the facilities E to be excluded. In the block consisting of the facilities E to be excluded, "C_2", "MAR_OUT" and "M_W" are input signals (terminals).

When the process of step S224 is complete, the flow returns to step S17; however, since there is no further operation OP having "M" on the left-hand side in this embodiment, the flow leaves the loop of steps S17 to S22. That is, no operation OP having "M" on the left-hand side is found in step S18, the decision in this step becomes "NO", causing the flow to advance to step S23.

Finally, the flag in the table F is disabled in step S23 and the flow will be terminated. More specifically, what is performed in step S23 is "if an input terminal corresponding to the reference facility x belonging to the excluding facilities E is not in the table F, register it disable the flag of x, and replace the reference of the facility x with that of the input terminal", and all the operations OP having "M" on the left-hand side have been registered, so that the overall process is terminated after the flag of "M" in the table F is disabled (set to "0").

Through the above processing, the resource table F shown in FIG. 28 is prepared, and the tree structure of the block consisting of other facilities than the facilities E to be excluded and the tree structure of the block consisting of the facilities E to be excluded are produced, and they are stored in the functional specification storage 1.

FIGS. 25 and 26 illustrate the results of displaying the functional description of the block consisting of other facilities than the facilities E to be excluded by the specification description display 2. FIG. 26 shows the continuation of FIG. 25, partially overlapping the latter. In the functional description in FIGS. 25 and 26, the operation concerning "M" specified by the facility indicator 3 is replaced with the operation concerning "M_IN", "M_W" and "MAR_OUT" and the operation for setting their associated control signals "C_11" and "C_2" ON (i.e., "1"; flag on).

FIG. 29 illustrates the results of displaying the functional description of the block consisting of the facilities E to be excluded by the specification description display 2. In the above manner, the functional description shown in FIGS. 4 and 5 can be separated into the description of the memory block (FIG. 29) and the functional description of the block excluding the memory (FIGS. 25 and 26) through the signals "C_1", "C_2" produced by the interface signal generator 5 and "M_IN", "M_W" and "MAR_OUT". This relation is illustrated in FIG. 30.

As a result, for example, the description in FIGS. 25 and 26 is rewritten into a functional description necessary only for the block that is suitable for logical synthesis system and the necessary relation between the interface signals is covered. That functional description can therefore be used as an input to the logic synthesis system with high reliability.

Supplemental explanation of step S21 in FIG. 7 will be given below. The contents of the process of step S21 are as shown in FIG. 10; if the output terminal d_out corresponding to d is not in the table F, it is registered in this table F (S211), then, the statement mentioning that the right-hand side of the assignment statement s including an operation OP is the output terminal d_out is added to the block consisting of the facilities E to be excluded with a condition (S212), and the flow advances to step S17.

By merely designating only the facilities appearing in the validated functional specification, the present system, as described above, can automatically generate the functional specification of the block consisting of the specified facilities and that of the block consisting of other facilities than the specified ones, from the validated functional specification.

The present system can thus provide a flexible design scheme to allow the functional specification to be separated into the blocks of the control logic and the data path, or into the memory portion and the other portion, and the circuit portion having sequential circuit combined to ensure block-by-block logic synthesis, allow the functional specifications of the blocks to be used as inputs of CAD tools or allow to find out different design schemes for the divided blocks. The results of the division can be output in the form of a text to be clearly left as a design document.

At the time the functional specification is described, the designer can exclusively work on writing the function of the intended hardware to be executed without performing the block division in consideration of the aforementioned logic design, so that the improvement on the work efficiency can be expected. There is another advantage that the automatic division can eliminate errors which can conventionally occur in the extraction of the interface signals between blocks and rewriting the functional description. Further, the present system can eliminate the need for the validation of the functions of the description after the block division which is needed in the conventional manual division, thus reducing the number of steps needed for wiring the functional specification and validating it.

The present invention is not limited to the above-described embodiment, but may be modified in various manners without departing from the scope and spirit of the invention.

In the above-described embodiment, the instruction through the facility indicator 3 is made by indicating the names of the facilities, such as registers and terminals, declared in the description, and the analysis by the I/O source analyzer 4 is done in such a way that attention is paid only to the assignment operation ("=") in the description and the functional description is divided also involving the indicated facilities and other operations than assignment, such as "+" and "−", which have the indicated facilities as operands. For instance, an operation symbol (other than assignment) for a description corresponding to functional elements may be specified to separate the functional description into an operation portion and its I/O facility portion as in the case where, by specifying the symbol "+" on the 27th line in the functional description in FIGS. 4 and 5, the description of the block consisting of the functional elements to execute this addition and the description of the block consisting other elements than the functional elements are generated. This may permit the functional description to be divided into the description of the functional elements concerning manual design and that of the portion subjected to logic synthesis.

In the above embodiment, the description of the block consisting of the facilities indicated by the facility indicator 3 serves as a document for manual design and has only the functional description and no declarative part as in the samples shown in FIGS. 18 and 29. In the case where such description is used as an input for CAD tools, or the like, the description may include a declarative part as shown in FIG. 27.

While the method of division by the functional specification dividing means in the above-described embodiment causes the divided blocks to be on the same hierarchical level, the division may be conducted to yield such a hierarchical structure that one block becomes a subblock of the other, as shown in FIG. 31.

In addition, in generating the functional specifications for the individual blocks in the functional specification divider 6, the number of the ports may be shared by merging those portions having logically equivalent interface signal to thereby minimize the number of ports, for example, by using an algorithm shown in FIG. 32.

In the above embodiment, the facilities to be excluded are specified by the facility indicator 3. The functional description can be divided by using above described method, after the facilities not to be excluded are specified by the facility indicator 3 and the facilities to be excluded are automatically acquired by the system.

In short, the present system can select the functional description of a block of functional elements that belong to manual design, from the validated description which is to be used in a processing system for processing the functional specification of the intended hardware described in a hardware description language to automatically generate the hardware of the necessary individual functional elements, and can use the remaining functional elements in an automatic hardware synthesis system. This system comprises functional specification storage means for storing the validated specification of target hardware; indication means for indicating functional elements to be excluded; input/output source analyzing means for acquiring input/output elements associated with the functional elements indicated by the indication means; interface signal generating means for generating all necessary interface signal information to be exchanged between two blocks in the case where the functional specification stored in the functional specification storage means is divided into the functional specification of a block consisting of the functional elements indicated by the indication means and that of a block consisting of other functional elements than the indicated functional elements, based on the results of analysis done by the input/output source analyzing means and information of the functional elements indicated by the indication means; and functional specification dividing means for excluding the functional specification of the functional elements indicated by the indication means from the functional specification stored in the functional description storage means and receiving the interface signal information generated by the interface signal generating means to produce the functional specification of the block consisting of other functional elements than the functional elements indicated by the indication means block, and receiving the interface signal information generated by the interface signal generating means to produce the functional specification of the block consisting of the functional elements indicated by the indication means block based on the storage contents of the functional specification storage means. With this arrangement, when the validated functional specification is stored in the functional specification storage means and the functional elements to be excluded are indicated by the indication means, the input/output source analyzing means acquires those input/output elements which are associated with the functional elements indicated by the indication means, and the interface signal generating means generates all necessary interface signal information to be exchanged between two blocks in the case where the functional specification stored in the functional specification storage means is divided into the functional specification of a block consisting of the functional elements indicated by the indication means and that of a block consisting of other functional elements than the indicated functional elements, based on the results of analysis done by the input/output source analyzing means and information of the functional elements indicated by the indication means.

The functional specification dividing means excludes the functional elements indicated by the indication means from the contents of the validated functional specification stored in the functional specification storage means and receives information of the signals generated by the interface signal generating means to generate the functional specification of the block consisting of other functional elements than those indicated by the indication means, and receives information of the signals generated by the interface signal generating means to generate the functional specification of the block consisting of the functional elements indicated by the indication means based on the storage contents of the functional specification storage means.

Accordingly, by merely specifying the functional elements that belong to manual designing, the validated functional description is automatically divided into the functional specification of a block of the specified functional elements and that of a block of the remaining functional elements, and signals (interface signals) that should be exchanged between both blocks are analyzed and extracted, whereby the functional specification of the specified functional elements and that of the remaining functional elements can automatically be generated while reflecting the information of the necessary interface signals on those specifications.

The present system can therefore select the functional description of the block of functional elements (facilities) that belong to manual designing, from the validated functional description which is to be used in a processing system for processing the functional specification of the intended hardware described in a hardware description language to automatically generate the hardware of the necessary individual functional elements, and can use the remaining functional elements directly in an hardware automatic synthesis system to automatically generate the intended hardware. It is therefore possible to significantly improve the operability by reducing the number of steps required for describing the functional specification and validation steps, thus improving the design efficiency.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A hardware design support method for use in a processing system for processing a general functional specification described in a hardware description language to generate intended functional elements, said general functional specification being divided into a functional specification for a first functional element block with first functional elements to be generated by said processing system and a second functional element block with second functional elements to be excluded from said first functional element block for reedition, said hardware design support method comprising:

a first step of acquiring one of a first input/output elements corresponding to said second functional elements, and a second input/output elements corresponding to said first functional elements;

a second step of executing one of a first operation which generates necessary interface signal information to be exchanged between said first functional element block and said second functional element block, based on said first input/output elements and said second functional elements, and a second operation which generates necessary interface signal information to be exchanged between said second functional element block and said first functional element block, based on said second input/output elements and information of said first functional elements; and a third step of excluding said functional specification of said second functional elements from said general functional specification and receiving said interface signal information generated to produce a functional specification of at least one of said first functional element block and said second functional element block.

2. The method according to claim 1, wherein said first step includes a step of inputting an information to specify said second functional elements to acquire said input/output elements.

3. The method according to claim 1, wherein said second step includes a step of preparing a table for storing said input/output elements and said interface signal information generated in association with said input/output elements.

4. The method according to claim 1, wherein said third step includes a step of sharing portions by merging those ports for which said interface signal information is logically equivalent.

5. A hardware design support system for use in a processing system for processing a general functional specification described in a hardware description language to generate intended functional elements, said general functional specification being divided into a functional specification for a first functional element block with first functional elements to be generated by said processing system and a second functional element block with second functional elements to be excluded from said first functional element block for reedition, said hardware design support system comprising:

indication means for inputting one of an information to specify said second functional elements and an information to specify said first functional elements;

interface signal generating means for executing one of a first operation and a second operation, said first operation acquiring input/output elements common to said first functional elements and said second functional elements according to said indication means and generating necessary interface signal information to be exchanged between said first functional element block and said second functional element block based on said input/output elements and said second functional elements, said second operation acquiring input/output elements common to said second functional elements and said first functional elements according to said indication means and generating necessary interface signal information to be exchanged between said second functional element block and said first functional element block based on said input/output elements and said first functional elements; and functional specification dividing means for replacing a description of said second functional elements described in said functional specification with a description using said interface signal information generated by said interface signal generating means to produce a functional specification of said first functional element block.

6. The system according to claim 5, further comprising:

specification description display means for displaying said functional specification as a hardware functional specification description in a text form.

7. The system according to claim 5, wherein said interface signal generating means includes means for assigning an identical interface signal to said input/output elements that are common.

8. The system according to claim 5, wherein said functional specification dividing means includes means for generating one interface signal information in relation to logically equivalent multiple functional elements.

9. The system according to claim 5, wherein said functional specification dividing means includes means for replacing descriptions of said first functional elements in said general functional specification to descriptions using said interface signal information and for generating a functional specification of said second functional elements.

10. The system according to claim 5, wherein said functional specification dividing means includes means for replacing the description of said first functional elements to null operation and adding the descriptions before replacing the description of said first functional elements to said null operation to the descriptions of said second functional elements.

11. The system according to claim 5, further comprising:

a table for storing said input/output elements and said interface signal information generated in association with said input/output elements.

12. The system according to claim 5, wherein said interface signal generating means includes a table for storing said input/output elements and said interface signal information generated in association with said input/output elements.

* * * * *